US006731759B2

(12) United States Patent
Terai et al.

(10) Patent No.: US 6,731,759 B2
(45) Date of Patent: May 4, 2004

(54) AUDIO SIGNAL REPRODUCTION DEVICE

(75) Inventors: Kenichi Terai, Osaka (JP); Hiroyuki Hashimoto, Osaka (JP); Isao Kakuhari, Nara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/956,192

(22) Filed: Sep. 19, 2001

(65) Prior Publication Data

US 2002/0051548 A1 May 2, 2002

(30) Foreign Application Priority Data

Sep. 19, 2000 (JP) ....................................... 2000-284362

(51) Int. Cl.[7] ............................ H04R 5/00; H04R 5/02; H03G 5/00

(52) U.S. Cl. ............................ 381/17; 381/26; 381/98; 381/310

(58) Field of Search ............................ 381/310, 98, 26, 381/17

(56) References Cited

FOREIGN PATENT DOCUMENTS

JP 5-252598 A * 3/1992

OTHER PUBLICATIONS

Merriam Webster's Collegiate Dictionary, Merriam Webster, 10$^{th}$ Edition, p. 1316.*

* cited by examiner

*Primary Examiner*—Forester W. Isen
*Assistant Examiner*—Elizabeth McChesney
(74) *Attorney, Agent, or Firm*—Snell & Wilmer, LLP

(57) ABSTRACT

An acoustic signal reproduction device includes a reproduction speaker and a signal processing section for generating an acoustic signal for causing a listener to recognize a reference speaker. The signal processing section includes a compensation data input section for receiving compensation data from the outside of the acoustic signal reproduction device and a calculation section for calculating the acoustic signal based on the audio signal and the compensation data and outputting the acoustic signal to the reproduction speaker. The compensation data has a value H/C, where H is a transfer function from the reference speaker to a control point located in the vicinity of an ear of the listener, and C is a transfer function from the reproduction speaker to the control point located in the vicinity of the ear of the listener.

7 Claims, 13 Drawing Sheets

AUDIO SIGNAL REPRODUCTION DEVICE

BACKGROUND OF THE INVENTION

1. Field of the Invention

The present invention relates to an acoustic signal reproduction device having an acoustic characteristic compensation function.

2. Description of the Related Art

Conventionally, there have been known technologies for setting a transfer function from a reference sound source to a listener as a coefficient of a convolutional calculation to carry out the convolutional calculation regarding an audio signal using such a coefficient, so as to cause the listener to recognize, or perceive, the reference sound source. One example of such technologies is disclosed in Japanese Laid-open Publication No. 11-27800 (Title of the Invention: STEREOPHONIC SOUND PROCESSING SYSTEM).

However, the conventional system has difficulties in causing the listener to correctly recognize the position of the reference sound source. The reason for this is that the conventional system does not take into account an acoustic characteristic of reproduction speakers (or headphones) used by the listener. Also, the transfer function from the reference sound source to the listener cannot be correctly reproduced.

SUMMARY OF THE INVENTION

According to one aspect of the present invention, there is provided an acoustic signal reproduction device according to the present invention including a reproduction speaker and a signal processing section for generating an acoustic signal for causing a listener to recognize a sound as coming from a reference speaker. The signal processing section includes a compensation data input section for receiving compensation data from the outside of the acoustic signal reproduction device and a calculation section for calculating the acoustic signal based on the audio signal and the compensation data and outputting the acoustic signal to the reproduction speaker. The compensation data has a value H/C, where H is a transfer function from the reference speaker to a control point located in the vicinity of an ear of the listener, and C is a transfer function from the reproduction speaker to the control point located in the vicinity of the ear of the listener.

In one embodiment of the invention, the reproduction speaker is located nearest to an ear hole of the listener so as to be out of contact with the ear of the listener and the control point is located between the ear hole of the listener and the reproduction speaker.

In one embodiment of the invention, the compensation data is prestored in a recording medium and the compensation data input section receives the compensation data read from the recording medium.

In one embodiment of the invention, the compensation data input section receives the compensation data via a network.

According to another aspect of the present invention, an acoustic signal reproduction device including: first and third reproduction speakers for a right ear of a listener; second and fourth reproduction speakers for a left ear of the listener; a signal processing section for processing first through fifth audio signals to generate first and second acoustic signals for causing the listener to recognize first through third reference speakers, and third and fourth acoustic signals for causing the listener to recognize fourth and fifth reference speakers. The signal processing section includes: a compensation data input section for receiving first to tenth compensation data from the outside of the acoustic signal reproduction device; a first calculation section for calculating the first acoustic signal based on the first through third audio signals and the first through third compensation data and outputting the first acoustic signal to the first reproduction speaker; a second calculation section for calculating the second acoustic signal based on the first through third audio signals and the fourth through sixth compensation data and outputting the second acoustic signal to the second reproduction speaker; a third calculation section for calculating the third acoustic signal based on the fourth and fifth audio signals and the seventh and eighth compensation data and outputting the third acoustic signal to the third reproduction speaker; and a fourth calculation section for calculating the fourth acoustic signal based on the fourth and fifth audio signals and the ninth and tenth compensation data and outputting the fourth acoustic signal to the fourth reproduction speaker. The first compensation data has a value $H_{1R}/C_1$, the second compensation data has a value $H_{2R}/C_1$, the third compensation data has a value $H_{3R}/C_1$, the fourth compensation data has a value $H_{1L}/C_2$, the fifth compensation data has a value $H_{2L}/C_2$, the sixth compensation data has a value $H_{3L}/C_2$, the seventh compensation data has a value $H_{4R}/C_3$, the eighth compensation data has a value $H_{5R}/C_3$, the ninth compensation data has a value $H_{4L}/C_4$, and the tenth compensation data has a value $H_{5L}/C_4$. $H_{1R}$ is a transfer function from the first reference speaker to a control point located in the vicinity of a right ear of the listener, $H_{2R}$ is a transfer function from the second reference speaker to the control point located in the vicinity of the right ear of the listener, $H_{3R}$ is a transfer function from the third reference speaker to the control point located in the vicinity of the right ear of the listener, $H_{4R}$ is a transfer function from the fourth reference speaker to the control point located in the vicinity of the right ear of the listener, and $H_{5R}$ is a transfer function from the fifth reference speaker to the control point located in the vicinity of the right ear of the listener. $H_{1L}$ is a transfer function from the first reference speaker to a control point located in the vicinity of a left ear of the listener, $H_{2L}$ is a transfer function from the second reference speaker to the control point located in the vicinity of the left ear of the listener, $H_{3L}$ is a transfer function from the third reference speaker to the control point located in the vicinity of the left ear of the listener, $H_{4L}$ is a transfer function from the fourth reference speaker to the control point located in the vicinity of the left ear of the listener, and $H_{5L}$ is a transfer function from the fifth reference speaker to the control point located in the vicinity of the left ear of the listener. $C_1$ is a transfer function from the first reproduction speaker to the control point located in the vicinity of the right ear of the listener, $C_2$ is a transfer function from the second reproduction speaker to the control point located in the vicinity of the left ear of the listener, $C_3$ is a transfer function from the third reproduction speaker to the control point located in the vicinity of the right ear of the listener, and $C_4$ is a transfer function from the fourth reproduction speaker to the control point located in the vicinity of the left ear of the listener.

In one embodiment of the invention, the first reference speaker is a virtual sound source located on a straight line making an angle of about zero degrees with a straight line running through the center of the head of the listener, the second reference speaker is a virtual sound source located on a straight line making an angle of about +30 degrees with the straight line running through the center of the head of the listener, the third reference speaker is a virtual sound source located on a straight line making an angle of about −30 degrees with the straight line running through the center of the head of the listener, the fourth reference speaker is a virtual sound source located on a straight line making an angle of about +110 degrees to about +120 degrees with the straight line running through the center of the head of the listener, and the fifth reference speaker is a virtual sound source located on a straight line making an angle of about −110 degrees to about −120 degrees with the straight line running through the center of the head of the listener.

In one embodiment of the invention, the first through fourth reproduction speakers are included in headphones, the first reproduction speaker and the second reproduction speaker are located forward with respect to a vertical plane including a straight line connecting a hole of the right ear and a hole of the left ear of the listener, the third reproduction speaker and the fourth reproduction speaker are located rearward with respect to the vertical plane, and the first through fourth reproduction speakers are out of contact with the right ear and the left ear of the listener.

Thus, the invention described herein makes possible the advantages of providing: (1) an acoustic signal reproduction device which is capable of causing a listener to correctly recognize a sound as coming from a reference speaker by taking into account an acoustic characteristic of reproduction speakers (or headphones) used by the listener; (2) an acoustic signal reproduction device which is capable of compensating for an acoustic characteristic so as to be adapted for a reproduction speaker actually used by a listener; and (3) an acoustic signal reproduction device which is capable of lessening an influence of a difference in the head shape among individual listeners on acoustic characteristic compensation effects.

These and other advantages of the present invention will become apparent to those skilled in the art upon reading and understanding the following detailed description with reference to the accompanying figures.

DESCRIPTION OF THE PREFERRED EMBODIMENTS

Figure 1:
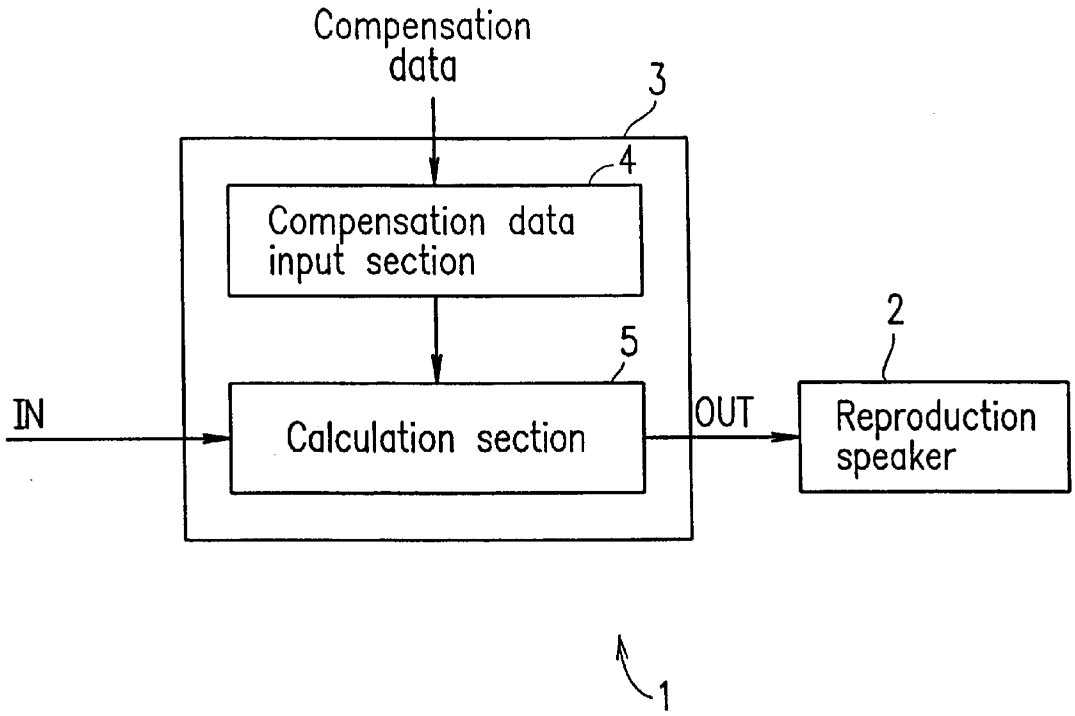
FIG. 1 is a block diagram illustrating a structure of an acoustic signal reproduction device 1 according to the present invention.

Referring to FIG. 1, a principle of the present invention will be described below.

FIG. 1 is a block diagram illustrating a structure of an acoustic signal reproduction device 1 according to the present invention. The acoustic signal reproduction device 1 has an acoustic characteristic compensation feature.

The acoustic signal reproduction device 1 includes a reproduction speaker 2 and a signal processing section 3 for processing an audio signal IN to generate an acoustic signal OUT for causing a listener to recognize a sound as coming from a reference speaker. The term "reference speaker" described herein means a virtual sound source which is recognized to be present in a prescribed (reference) direction by a listener.

The signal processing section 3 includes a compensation data input section 4 for receiving compensation data from the outside of the acoustic signal reproduction device 1 and a calculation section 5 for calculating the acoustic signal OUT based on the audio signal IN and the compensation data. The acoustic signal OUT calculated by the calculation section 5 is output to the reproduction speaker 2.

A value X of the compensation data is set so as to fulfill the following expression (1):

$$X=H/C \qquad \text{expression (1)}$$

Here, H is a transfer function from the reference speaker to a control point located in the vicinity of a right or left ear of the listener, and C is a transfer function from the reproduction speaker 2 to the control point located in the vicinity of the right or left ear of the listener.

In the present specification, the description "a control point located in the vicinity of a right or left ear of a listener" includes "a control point located in a right or left ear hole of a listener" (hereinafter, referred to also as the "ear canal inlet control point e") and "a control point located between a right or left ear hole of a listener and a reproduction speaker located nearest to the ear hole" (hereinafter, referred to as the "intermediate control point s").

The value X of the compensation data may be set as, for example, a coefficient of a convolution calculation. In such a case, the calculation section 5 carries out the convolution calculation regarding an audio signal IN using the coefficient.

The sound P reaching the listener is represented by the following expression (2):

$$P=IN*X*C=IN*(H/C)*C=IN*H \qquad \text{expression (2)}$$

From expression (2), it is appreciated that the listener recognizes as if the sound reaches the ear of the listener from the reference speaker through the transfer function H while the sound actually reaches the ear of the listener from the reproduction speaker 2 through the transfer function C. Thus, the listener can correctly recognize the sound as coming from the reference speaker.

Figure 2A:
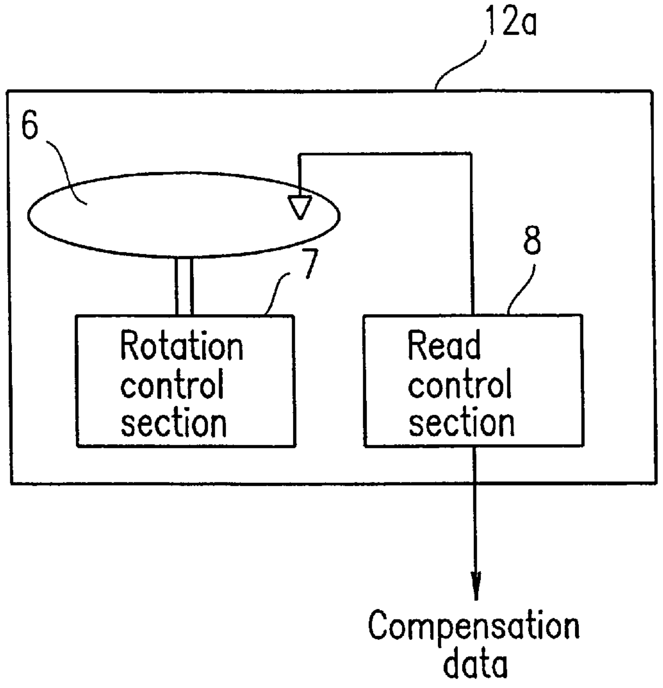
FIG. 2A is a diagram illustrating an example of receiving compensation data read from a recording medium 6.
Figure 2B:
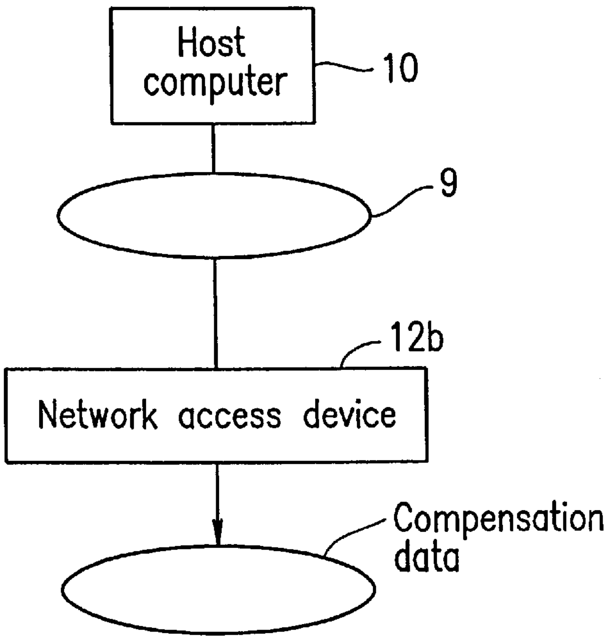
FIG. 2B is a diagram illustrating an example of receiving compensation data via a network 9.

FIGS. 2A and 2B are block diagrams each illustrating how the compensation data is received by the compensation data input section 4.

The compensation data input section 4 receives compensation data in any suitable manner. Referring to FIG. 2A, for example, when the compensation data is prestored in a recording medium 6, the compensation data input section 4 may receive the compensation data from a reproduction device 12*a* which is able to reproduce the recording medium 6. In this case, the reproduction device 12*a* includes at least a rotation control section 7 for controlling the rotation of the recording medium 6 and a read control section 8 for controlling the reading of the compensation data prestored in the recording medium 6.

The recording medium 6 may be any type of recording medium. For example, the recording medium 6 may be a DVD-ROM disc packaged with the reproduction speaker 2. The recording medium 6 in which the compensation data is prestored may or may not be the same recording medium in which the audio signal is prestored.

Referring to FIG. 2B, when the acoustic signal reproduction device 1 is connected to a network 9 via a network access device 12*b*, the compensation data input section 4 may download the compensation data from another device (e.g., a host computer 10) connected to the network 9.

The network 9 may be any type of network, e.g., the Internet.

When the listener uses a plurality of types of reproduction speakers, the compensation data may be prepared for each type of the reproduction speakers. For example, a plurality of types of compensation data corresponding to the respective types of the reproduction speakers may be prestored in the recording medium 6. Thus, it is possible to appropriately compensate for acoustic characteristics of the reproduction speakers actually used by the listener. As a result, the listener can correctly recognize the reference speaker, regardless of the type of the reproduction speakers actually used by the listener.

Hereinafter, the present invention will be described by way of illustrative examples with reference to the accompanying drawings.

EXAMPLE 1

Figure 3:
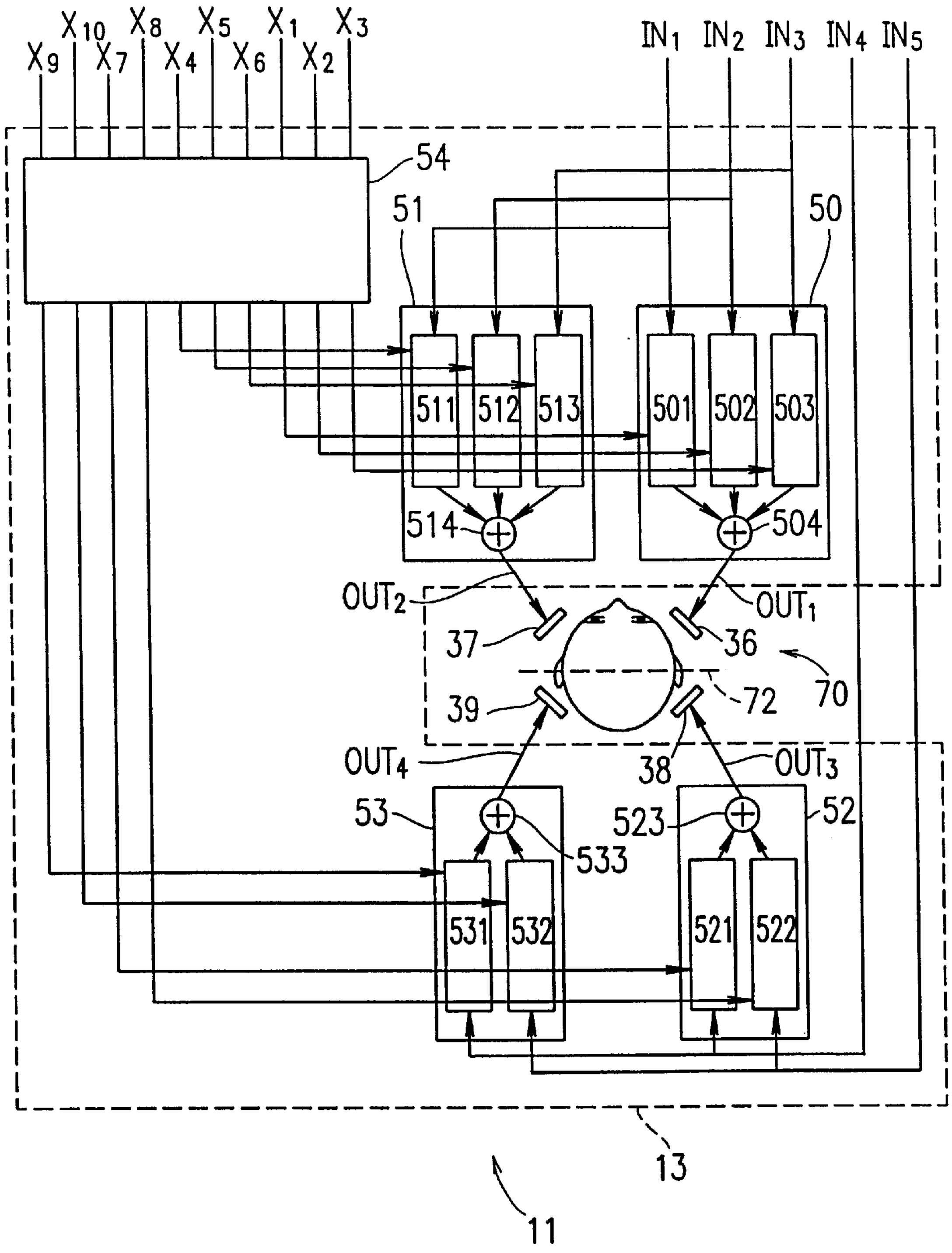
FIG. 3 is a diagram illustrating a structure of an acoustic signal reproduction device 11 according to Example 1 of the present invention.

FIG. 3 is a diagram illustrating a structure of an acoustic signal reproduction device 11 according to Example 1 of the present invention.

The acoustic signal reproduction device 11 includes a right ear reproduction speaker 36 (first speaker), a right ear reproduction speaker 38 (third speaker), a left ear reproduction speaker 37 (second speaker), and a left ear reproduction speakers 39 (fourth speaker).

The acoustic signal reproduction device 11 further includes a signal processing section 13 for processing audio signals $IN_1$, $IN_2$, $IN_3$, $IN_4$, and $IN_5$ to generate a first acoustic signal $OUT_1$, a second acoustic signal $OUT_2$, a third acoustic signal $OUT_3$, and a fourth acoustic signal $OUT_4$. The first acoustic signal $OUT_1$ and the second acoustic signal $OUT_2$ cause a listener to recognize a reference speaker 31, a reference speaker 32, and a reference speaker 33. The third acoustic signal $OUT_3$ and the fourth acoustic signal $OUT_4$ cause the listener to recognize a reference speaker 34 and a reference speaker 35.

The positional arrangement of the reference speakers 31 to 35 will be described in detail below with reference to FIG. 4.

The signal processing section 13 includes: a compensation data input section 54 for receiving first through tenth compensation data from the outside of the acoustic signal reproduction device 11, a first calculation section 50 for outputting the first acoustic signal $OUT_1$ to the reproduction speaker 36, a second calculation section 51 for outputting the second acoustic signal $OUT_2$ to the reproduction speaker 37, a third calculation section 52 for outputting the third acoustic signal $OUT_3$ to the reproduction speaker 38, and a fourth calculation section 53 for outputting the fourth acoustic signal $OUT_4$ to the reproduction speaker 39.

The first calculation section 50 includes a digital filter 501, a digital filter 502, and a digital filter 503, and an adder 504 for adding outputs from the digital filters 501 through 503 together. A value $X_1$ of the first compensation data is preset as a coefficient of the digital filter 501. A value $X_2$ of the second compensation data is preset as a coefficient of the digital filter 502. A value $X_3$ of the third compensation data is preset as a coefficient of the digital filter 503. The compensation data input section 54 sets these coefficients.

The digital filter 501 carries out a convolution calculation regarding the audio signal $IN_1$, using the value $X_1$ of the first compensation data as a coefficient.

The digital filter 502 carries out a convolution calculation regarding the audio signal $IN_2$ using the value $X_2$ of the second compensation data as a coefficient.

The digital filter 503 carries out a convolution calculation regarding the audio signal $IN_3$ using the value $X_3$ of the third compensation data as a coefficient.

The calculation results from the digital filters 501 through 503 are added together by the adder 504, and the addition result is output as the first acoustic signal $OUT_1$ to the reproduction speaker 36.

The respective values $X_1$, $X_2$, and $X_3$ of the first through third compensation data are set so as to fulfill the following expression (3):

$$X_1 = H_{1R}/C_1 \quad \text{expression (3)}$$
$$X_2 = H_{2R}/C_1$$
$$X_3 = H_{3R}/C_1$$

Here, $H_{1R}$ is a transfer function from the reference speaker 31 (FIG. 4) to the control point located in the vicinity of the right ear of the listener, $H_{2R}$ is a transfer function from the reference speaker 32 to the control point located in the vicinity of the right ear of the listener, $H_{3R}$ is a transfer function from the reference speaker 33 to the control point located in the vicinity of the right ear of the listener, and $C_1$ is a transfer function from the reproduction speaker 36 to the control point located in the vicinity of the right ear of the listener.

As described above, the first calculation section 50 calculates the first acoustic signal $OUT_1$ based on the audio signals $IN_1$ to $IN_3$ and the first to third compensation data (values $X_1$ through $X_3$) and outputs the first acoustic signal $OUT_1$ to the reproduction speaker 36.

The second calculation section 51 includes a digital filter 511, a digital filter 512, and a digital filter 513, and an adder 514 for adding outputs from the digital filters 511 through 513 together. A value $X_4$ of the fourth compensation data is preset as a coefficient of the digital filter 511. A value $X_5$ of the fifth compensation data is preset as a coefficient of the digital filter 512. A value $X_6$ of the sixth compensation data is preset as a coefficient of the digital filter 513. The compensation data input section 54 sets these coefficients.

The digital filter 511 carries out a convolution calculation regarding the audio signal $IN_1$ using the value $X_4$ of the fourth compensation data as a coefficient.

The digital filter 512 carries out a convolution calculation regarding the audio signal $IN_2$ using the value $X_5$ of the fifth compensation data as a coefficient.

The digital filter 513 carries out a convolution calculation regarding the audio signal $IN_3$ using the value $X_6$ of the sixth compensation data as a coefficient.

The calculation results from the digital filters 511 through 513 are added together by the adder 514, and the addition result is output as the second acoustic signal $OUT_2$ to the reproduction speaker 37.

The respective values $X_4$, $X_5$, and $X_6$ of the fourth through sixth compensation data are set so as to fulfill the following expression (4):

$$X_4 = H_{1L}/C_2 \qquad \text{expression (4)}$$

$$X_5 = H_{2L}/C_2$$

$$X_6 = H_{3L}/C_2$$

Here, $H_{1L}$ is a transfer function from the reference speaker 31 (FIG. 4) to the control point located in the vicinity of a left ear of the listener, $H_{2L}$ is a transfer function from the reference speaker 32 to the control point located in the vicinity of the left ear of the listener, $H_{3L}$ is a transfer function from the reference speaker 33 to the control point located in the vicinity of the left ear of the listener, and $C_2$ is a transfer function from the reproduction speaker 37 to the control point located in the vicinity of the left ear of the listener.

As described above, the second calculation section 51 calculates the second acoustic signal $OUT_2$ based on the audio signals $IN_1$ through $IN_3$ and the fourth through sixth compensation data (values $X_4$ through $X_6$) and outputs the second acoustic signal $OUT_2$ to the reproduction speaker 37.

The third calculation section 52 includes a digital filter 521 and a digital filter 522, and an adder 523 for adding outputs from the digital filters 521 and 522 together. A value $X_7$ of the seventh compensation data is preset as a coefficient of the digital filter 521. A value $X_8$ of the eighth compensation data is preset as a coefficient of the digital filter 522. The compensation data input section 54 sets these coefficients.

The digital filter 521 carries out a convolution calculation regarding the audio signal $IN_4$ using the value $X_7$ of the seventh compensation data as a coefficient.

The digital filter 522 carries out a convolution calculation regarding the audio signal $IN_5$ using the value $X_8$ of the eighth compensation data as a coefficient.

The calculation results from the digital filters 521 and 522 are added together by the adder 523, and the addition result is output as the third acoustic signal $OUT_3$ to the reproduction speaker 38.

The respective values $X_7$ and $X_8$ of the seventh and eighth compensation data are set so as to fulfill the following expression (5):

$$X_7 = H_{4R}/C_3 \qquad \text{expression (5)}$$

$$X_8 = H_{5R}/C_3$$

Here, $H_{4R}$ is a transfer function from the reference speaker 34 (FIG. 4) to the control point located in the vicinity of the right ear of the listener, $H_{5R}$ is a transfer function from the reference speaker 35 to the control point located in the vicinity of the right ear of the listener, and $C_3$ is a transfer function from the reproduction speaker 38 to the control point located in the vicinity of the right ear of the listener.

As described above, the third calculation section 52 calculates the third acoustic signal $OUT_3$ based on the audio signals $IN_4$ and $IN_5$ and the seventh and eighth compensation data (values $X_7$ and $X_8$) and outputs the third acoustic signal $OUT_3$ to the reproduction speaker 38.

The fourth calculation section 53 includes a digital filter 531 and a digital filter 532, and an adder 533 for adding outputs from the digital filters 531 and 532 together. A value $X_9$ of the ninth compensation data is preset as a coefficient of the digital filter 531. A value $X_{10}$ of the tenth compensation data is preset as a coefficient of the digital filter 532. The compensation data input section 54 sets these coefficients.

The digital filter 531 carries out a convolution calculation regarding the audio signal $IN_4$ using the value $X_9$ of the ninth compensation data as a coefficient.

The digital filter 532 carries out a convolution calculation regarding the audio signal $IN_5$ using the value $X_{10}$ of the tenth compensation data as a coefficient.

The calculation results from the digital filters 531 and 532 are added together by the adder 533, and the addition result is output as the fourth acoustic signal $OUT_4$ to the reproduction speaker 39.

The respective values $X_9$ and $X_{10}$ of the ninth and tenth compensation data are set so as to fulfill the following expression (6):

$$X_9 = H_{4L}/C_4 \qquad \text{expression (6)}$$

$$X_{10} = H_{5L}/C_4$$

Here, $H_{4L}$ is a transfer function from the reference speaker 34 to the control point located in the vicinity of the left ear of the listener, $H_{5L}$ is a transfer function from the reference speaker 35 to the control point located in the vicinity of the left ear of the listener, and $C_4$ is a transfer function from the reproduction speaker 39 to the control point located in the vicinity of the left ear of the listener.

As described above, the fourth calculation section 53 calculates the fourth acoustic signal $OUT_4$ based on the audio signals $IN_4$ and $IN_5$ and the ninth and tenth compensation data (values $X_9$ and $X_{10}$) and outputs the fourth acoustic signal $OUT_4$ to the reproduction speaker 39.

The structure of the signal processing section 13 is not limited to the structure shown in FIG. 3. The signal processing section 13 may have any structure as long as the signal processing section 13 acts in a manner described above. For example, the signal processing section 13 may be realized in the form of hardware or software. Alternatively, a part of the signal processing section 13 may be realized in the form of hardware and the rest of the signal processing section 13 may be realized in the form of software.

Figure 4:
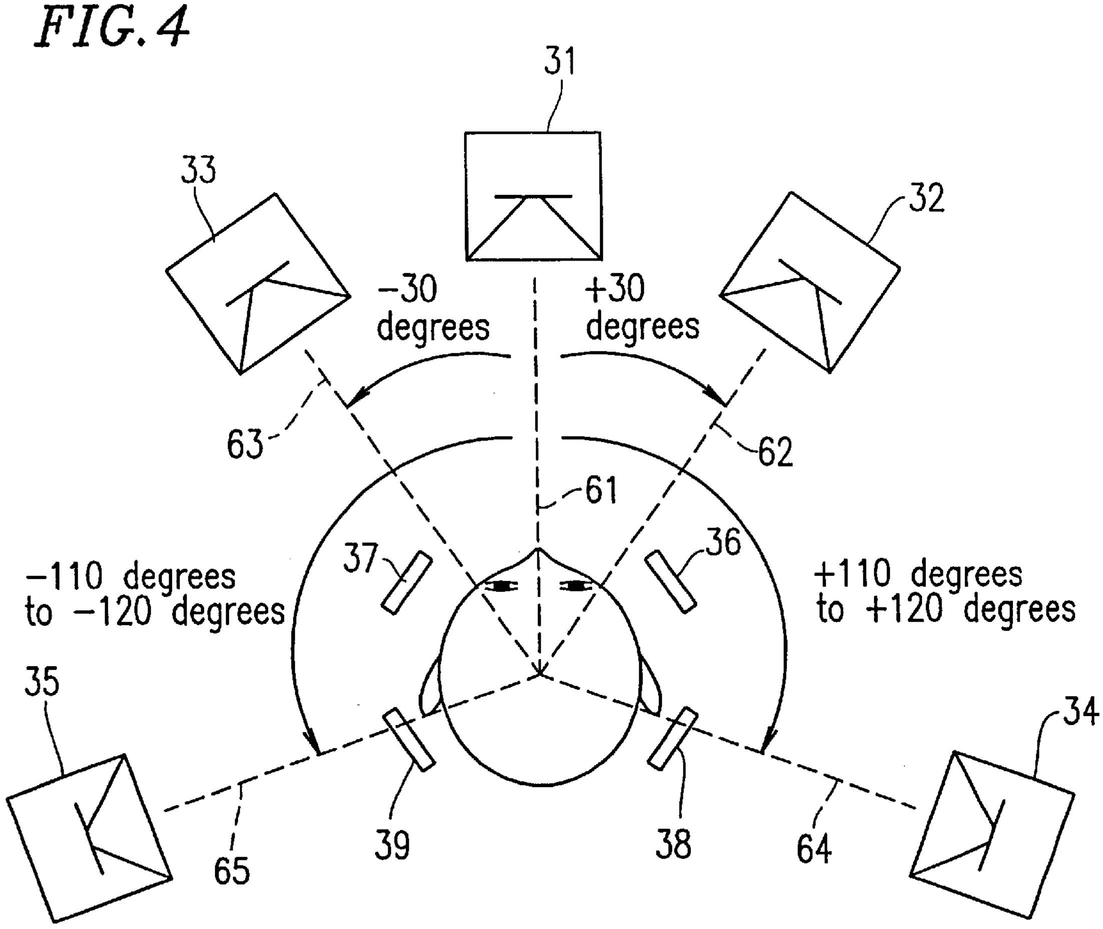
FIG. 4 is a diagram illustrating a positional arrangement of reference speakers 31 to 35 according to the present invention.

FIG. 4 shows an example of the positional arrangement of the five reference speakers 31 through 35. In the example shown in FIG. 4, the reference speakers 31 through 35 are located according to the IEC standard 4001. Each of the reference speakers 31 through 35 is a virtual sound source which is recognized to be present in a prescribed direction by the listener.

The reference speaker 31 (first reference speaker) is located on a straight line which makes an angle of about zero degrees with a straight line 61 running through the center of the head of the listener.

The reference speaker 32 (second reference speaker) is located on a straight line 62 which makes an angle of about +30 degrees with the line 61.

The reference speaker 33 (third reference speaker) is located on a straight line 63 which makes an angle of about −30 degrees with the line 61.

The reference speaker 34 (fourth reference speaker) is located on a straight line 64 which makes an angle of about +110 degrees to about +120 degrees with the line 61.

The reference speaker 35 (fifth reference speaker) is located on a straight line 65 which makes an angle of about −110 degrees to about −120 degrees with the line 61.

The positional arrangement of the reference speakers 31 through 35 is not limited to the positional arrangement shown in FIG. 4. The number of the reference speakers may be any integer equal to or more than 1.

It is preferable that the reproduction speakers 36 through 39 are included in headphones 70 (FIG. 3). The reproduction speakers 36 through 39 are supported by supports (not shown) included in the headphones 70.

In FIG. 3, reference numeral 72 represents a straight line connecting the right ear hole and the left ear hole of the listener. In the example shown in FIG. 3, the reproduction speakers 36 and 37 are located forward with respect to a vertical plane including the line 72. The reproduction speakers 38 and 39 are located backward with respect to the vertical plane including the line 72. The reproduction speakers 36 through 39 are located out of contact with the right and left ears of the listener. The positional arrangement of the reproduction speakers 36 through 39 is not limited to the above-described positional arrangement. For example, the reproduction speakers 36 through 39 may be in contact with the right or left ear of the listener.

Among acoustic signals for causing the listener to recognize a virtual sound source located behind the listener, acoustic signals having a frequency of a prescribed frequency fi or lower may be reproduced using the reproduction speakers 36 and 37. Among the acoustic signals for causing the listener to recognize the virtual sound source located behind the listener, acoustic signals having a frequency of a prescribed frequency fi or higher may be reproduced using the reproduction speakers 38 and 39. An acoustic signal having the prescribed frequency may be reproduced either using the reproduction speakers 36 and 37 or the reproduction speakers 38 and 39.

The prescribed frequency fi is preferably defined as the upper limit of the frequency band in which there is substantially no difference between the transfer function from a virtual source provided in front of the listener to the right (or left) ear of the listener (hereinafter, referred to as the "front transfer function") and the transfer function from the virtual sound source behind the listener to the right (or left) ear of the listener (hereinafter, referred to as the "rear transfer function"). In other words, the difference between the transfer functions is almost zero.

Using such a structure in which a part of the acoustic signals for causing the listener to recognize a virtual sound source located behind the listener are reproduced using the reproduction speakers 36 and 37, the reproduction speakers 38 and 39 can be reduced in size and weight.

In this case, the acoustic signals for causing the listener to recognize a virtual sound source located in front of the listener are reproduced using the reproduction speakers 36 and 37.

A difference between the front transfer function and the rear transfer function occurs because the head shape of the listener is asymmetric in the front-rear direction and the shape of the ears of the listener is asymmetric in the front-rear direction. However, the shape of the head and the shape of the ears are physically different in the front half and the rear half by merely a few centimeters or less.

The above-mentioned prescribed frequency fi can be specified in consideration of the relationship between the wavelength and the frequency of the acoustic signals. According to Example 1, the prescribed frequency fi is set at, for example, about 1 kHz to about 3 kHz.

The difference in the size of the head or ears among individuals is merely a few centimeters or less. Accordingly, the frequency at which the transfer functions start to differ due to the individual difference almost matches the prescribed frequency fi.

Figure 5:
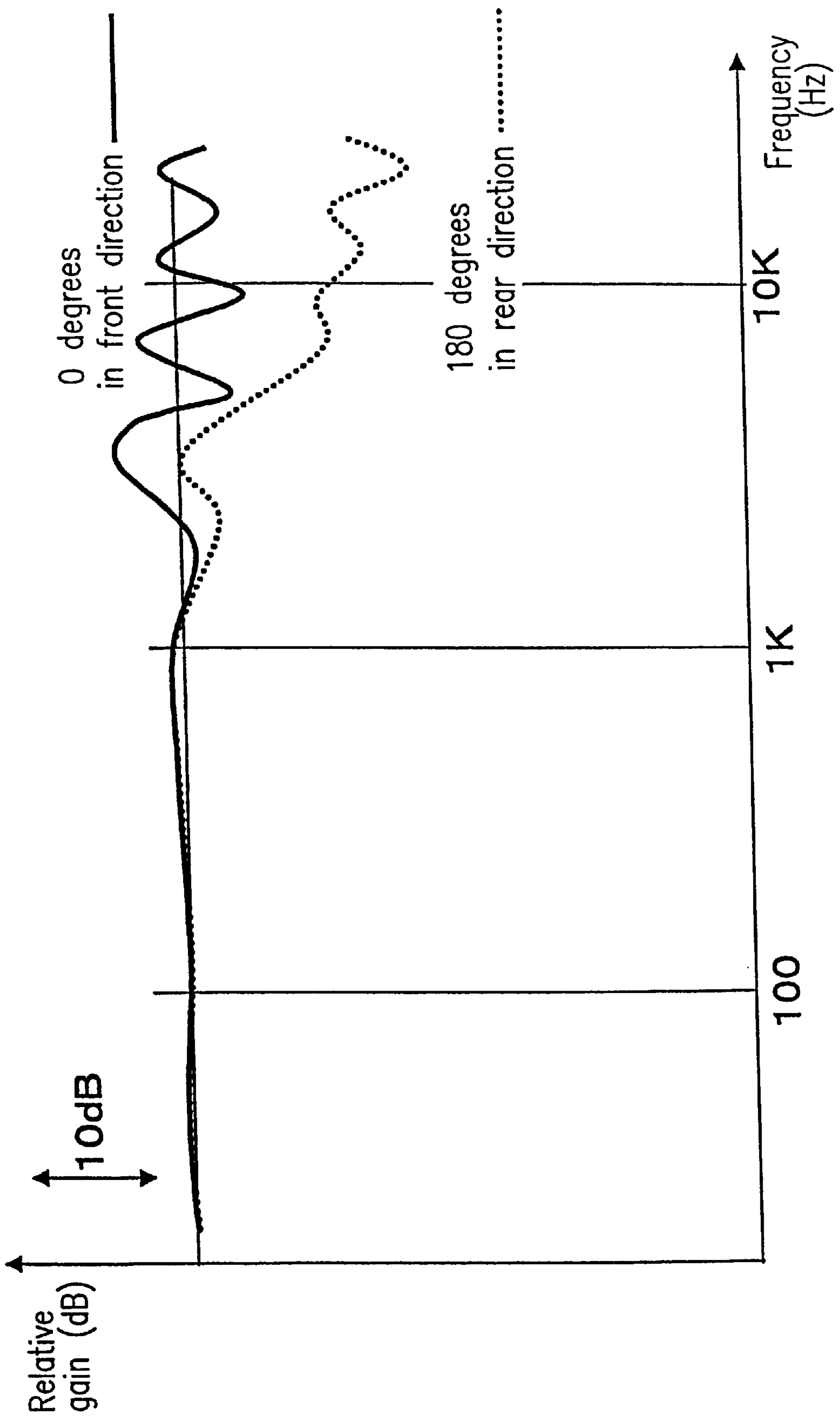
FIG. 5 is a graph illustrating an example of a front transfer function and a rear transfer function regarding a specific listener.

FIG. 5 is a graph illustrating an example of the front transfer function and the rear transfer function regarding a specific listener. The solid line represents an example of the head-related transfer function in the 0° direction (the direction straight ahead of the listener), and the dotted line represents an example of the head-related transfer function in the 180° direction (the direction directly behind the listener).

From the example shown in FIG. 5, it will be appreciated that the front transfer function and the rear transfer function are largely different from each other in the frequency band of about 1 kHz or more.

Figure 6:
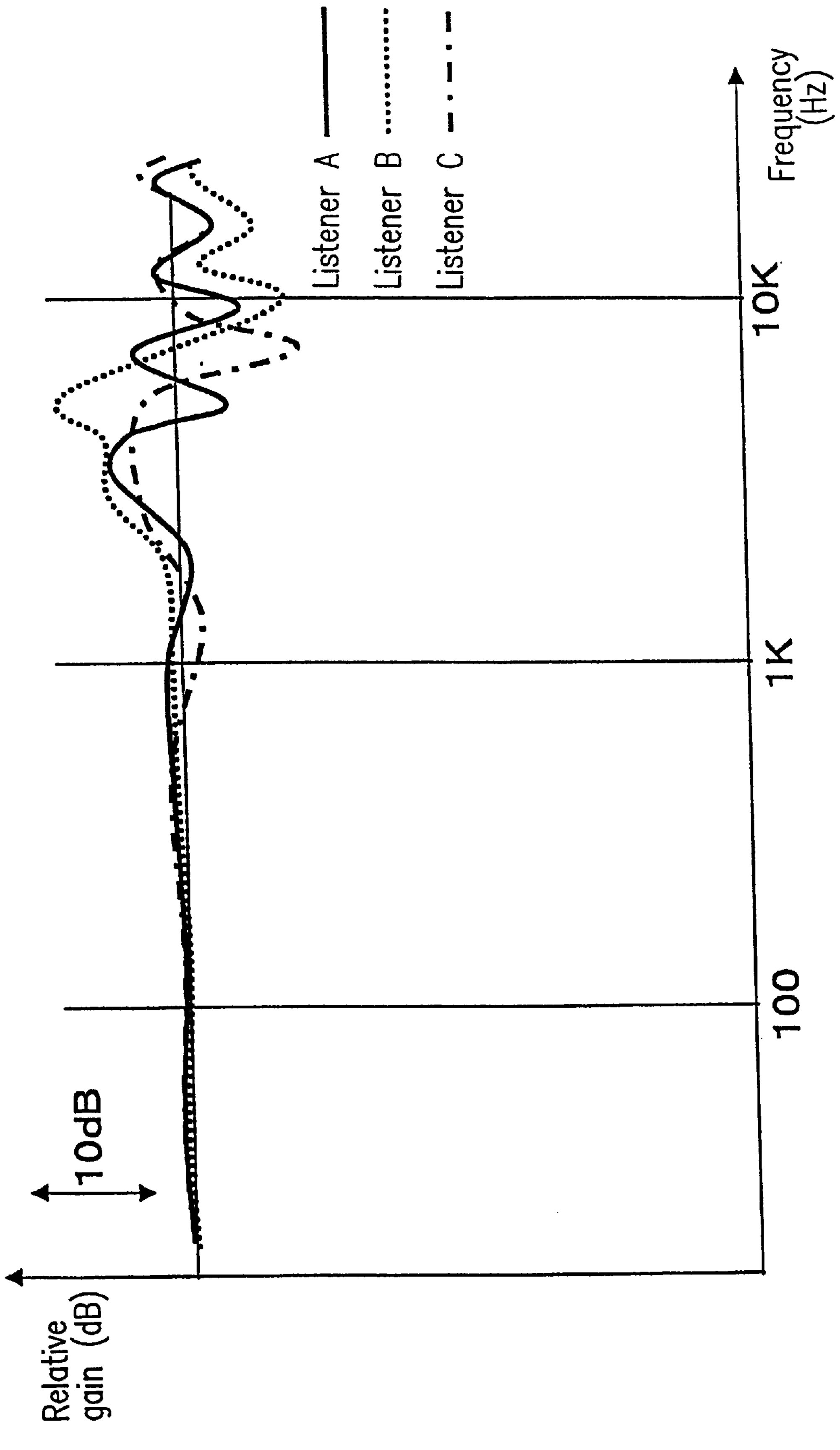
FIG. 6 is a graph illustrating an example of individual differences in a head-related transfer function.

FIG. 6 is a graph illustrating an example of the individual differences in the head-related transfer function in the 0° direction (the direction straight ahead of the listener). The solid line represents an example of the head-related transfer function of listener A, the dotted line represents an example of the head-related transfer function of listener B, and the chain line represents an example of the head-related transfer function of listener C. There is a difference in the head shape among the listeners A, B, and C.

From the example shown in FIG. 6, it will be appreciated that the head-related transfer functions of the three listeners are slightly different from one another in the frequency band of about 1 kHz or less and the head-related transfer functions of the three listeners are also largely different from one another in the frequency band of about 1 kHz or more.

In the example shown in FIGS. 5 and 6, it is desirable to set the prescribed frequency fi at about 1 kHz. By reproducing the acoustic signals having the prescribed frequency fi or lower (in which there is substantially no difference in the head-related transfer function regardless of the direction or the listener) using the reproduction speakers 36 and 37, the reproduction speakers 38 and 39 can have a smaller diaphragm and a more-lightweight magnetic circuit.

Next, a method for measuring the value $X_1$ of the first compensation data will be described with reference to FIG. 7. The process shown in block 400 is performed, and then the process shown in block 401 is performed.

Figure 7:
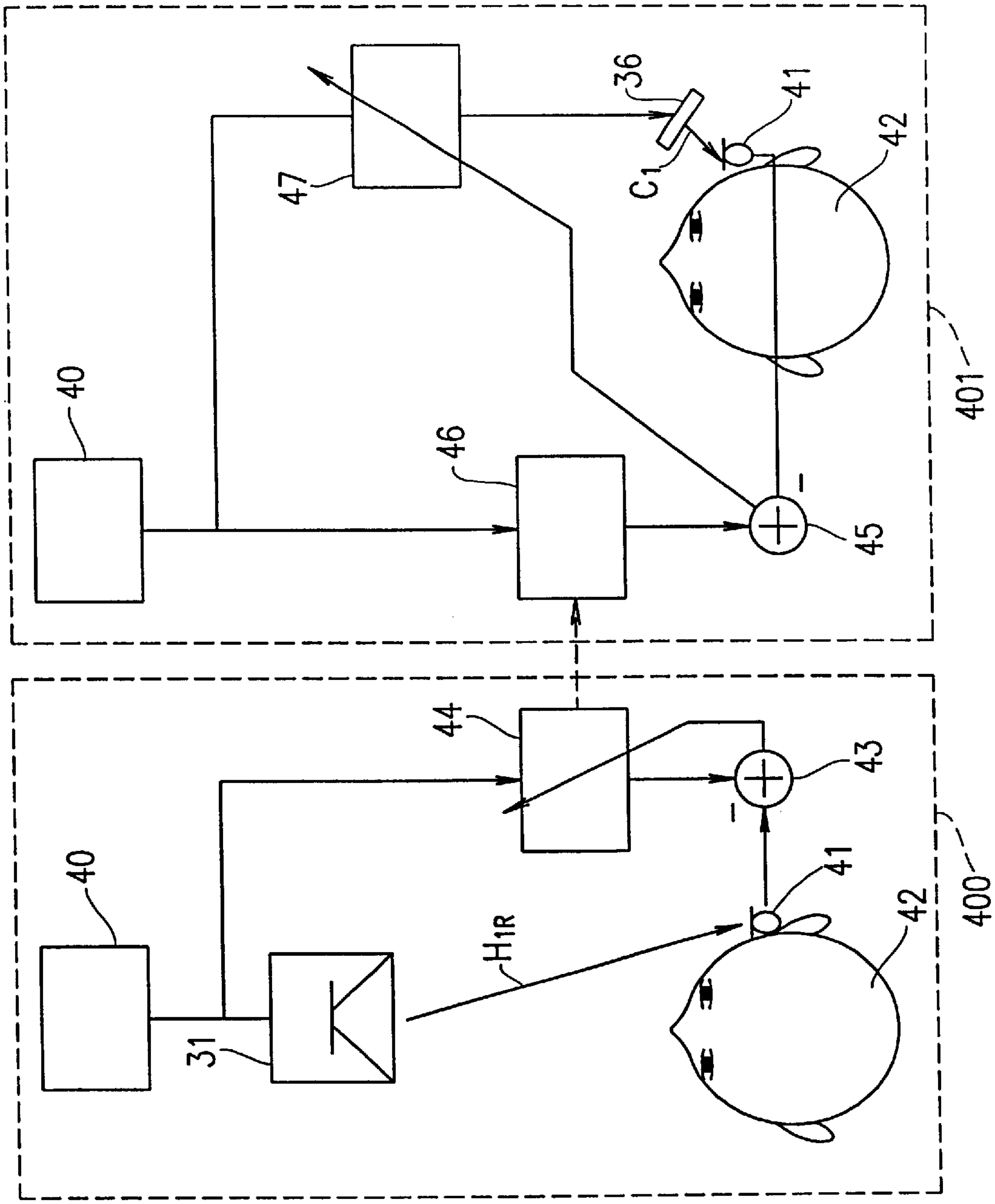
FIG. 7 is a diagram illustrating a method for obtaining a value $X_{1R}$ of first compensation data by measurement.

The process of FIG. 7 uses a broadband measurement signal generator 40, a microphone 41, a dummy head 42, adders 43 and 45, adaptive filters 44 and 47, and a digital filter 46 in addition to the reference speaker 31 and the reproduction speaker 36.

In block 400, the broadband measurement signal generator 40 outputs a broadband measurement signal. The signal output from the broadband measurement signal generator 40 is input to the reference speaker 31 and the adaptive filter 44.

In the descriptions regarding FIG. 7, the reference speaker 31 is actually present.

In the process of block 400, the reference speaker 31 produces sound responsive to the signal output from the broadband measurement signal generator 40. The sound produced by the reference speaker 31 is received by the microphone 41 located in the vicinity of the right ear of the dummy head 42 through the transfer function $H_{1R}$ from the reference speaker 31 to the microphone 41. The dummy head 42 described herein means a model designed to have a head-related transfer function which is common to as many listeners as possible.

The adder 43 receives outputs from the microphone 41 and the adaptive filter 44 and subtracts the output of the microphone 41 from the output of the adaptive filter 44. The adder 43 outputs a difference signal indicating a difference between the output from the adaptive filter 44 and the output from the microphone 41. The difference signal output from the adder 43 is fed back to the adaptive filter 44. The adaptive filter 44 updates its coefficient so that a value of the difference signal output from the adder 43 becomes as small as possible. Thus, the coefficient of the adaptive filter 44 substantially converges with the transfer function $H_{1R}$ from the reference speaker 31 to the microphone 41.

The coefficient of the adaptive filter 44 (i.e., the transfer function $H_{1R}$) is copied into the digital filter 46 in block 401 as its coefficient before the process in block 401 is begun.

Next, in the process of block 401, the broadband measurement signal generator 40 outputs a broadband measurement signal. The signal output from the broadband measurement signal generator 40 is input to the digital filter 46 and the adaptive filter 47.

The adaptive filter 47 outputs a signal to the reproduction speaker 36 and, responsive to the signal output from the adaptive filter 47, the reproduction speaker 36 produces sound. The sound produced by the reproduction speaker 36 is received by the microphone 41 located in the vicinity of the right ear of the dummy head 42 through the transfer function $C_1$ from the reproduction speaker 36 to the microphone 41.

The adder 45 receives outputs from the microphone 41 and the digital filter 46 and subtracts the output of the microphone 41 from the output of the digital filter 46. The adder 45 outputs a difference signal indicating a difference between the output from the digital filter 46 and the output from the microphone 41. The difference signal output from the adder 45 is fed back to the adaptive filter 47. The adaptive filter 47 updates its coefficient so that a value of the difference signal output from the adder 45 becomes as small as possible. Thus, the coefficient of the adaptive filter 47 substantially converges with the transfer function $H_{1R}/C_1$.

The coefficient of the adaptive filter 47 (i.e., the transfer function $H_{1R}/C_1$) is copied as the value $X_1$ of the first compensation data.

As described above, the value $X_1$ ($=H_{1R}/C_1$) of the first compensation data is obtained by measurement. The respective values $X_2$ through $X_{10}$ of the second through tenth compensation data can be obtained by measurement in a similar manner.

For example, the first through tenth compensation data may be recorded in the recording medium 6 of FIG. 2A. Alternatively, the first through tenth compensation data may be stored in a memory (not shown) of the host computer 10 of FIG. 2B in a downloadable form.

Figure 8:
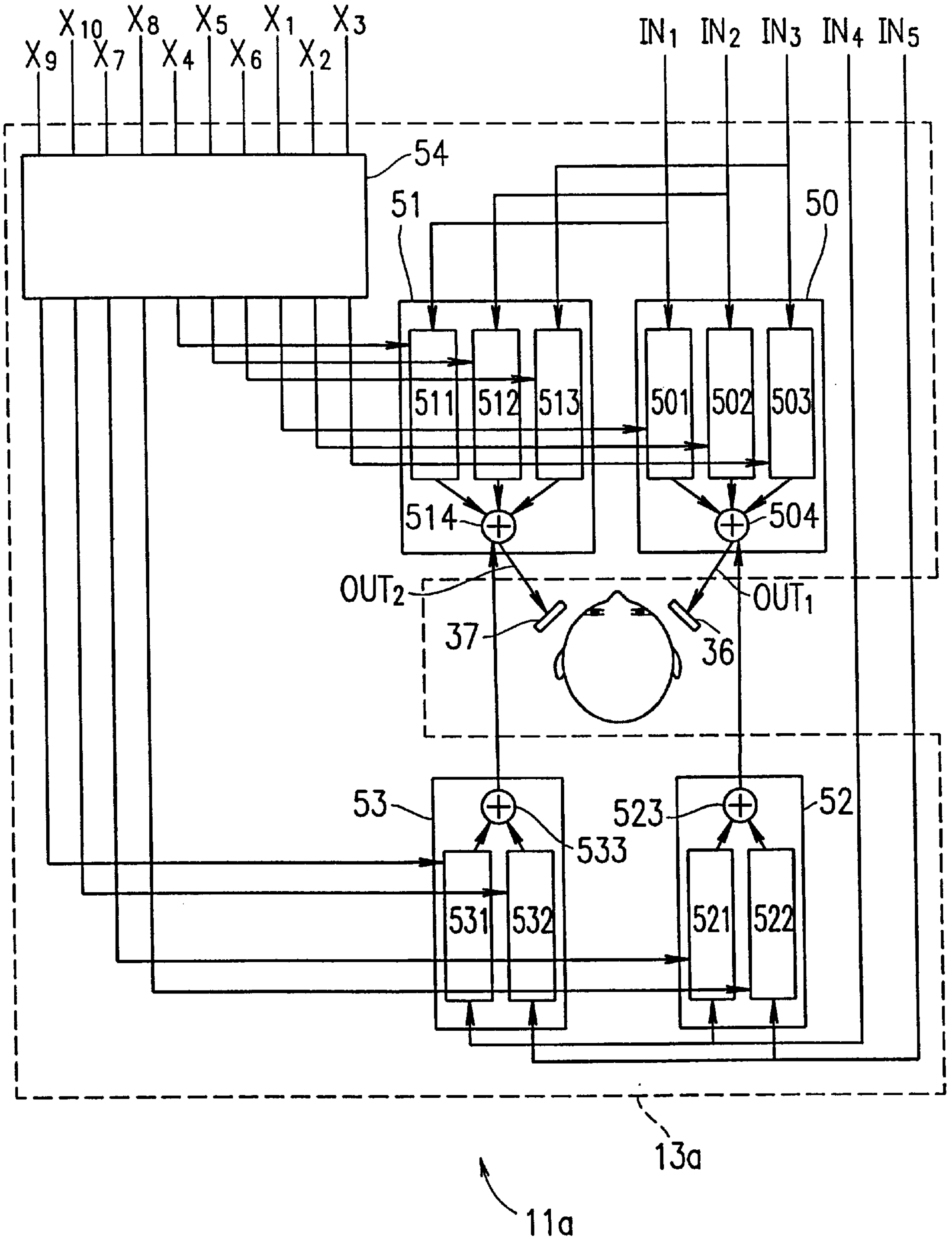
FIG. 8 is a diagram illustrating a structure of another acoustic signal reproduction device 11*a* according to Example 1 of the present invention.

FIG. 8 illustrates a structure of another acoustic signal reproduction device 11*a* according to Example 1 of the present invention. In FIG. 8, identical elements previously discussed with respect to FIG. 3 bear identical reference numerals and the descriptions thereof will be omitted.

The acoustic signal reproduction device 11*a* includes the right ear reproduction speaker 36 (first speaker), the left ear reproduction speaker 37 (second speaker), and a signal processing section 13*a*.

In the signal processing section 13*a*, the output from the adder 523 is supplied to the adder 504, and the output from the adder 533 is supplied to the adder 514.

The adder 504 adds the outputs from the digital filters 501 through 503 and the output from the adder 523. The addition result is output as the first acoustic signal $OUT_1$ to the reproduction speaker 36.

The adder 514 adds the outputs of the digital filters 511 through 513 and the output from the adder 533. The addition result is output as the second acoustic signal $OUT_2$ to the reproduction speaker 37.

In the acoustic signal reproduction device 11*a*, the reproduction speakers 38 and 39 shown in FIG. 3 are not used. Accordingly, it is possible to provide an acoustic signal having a compensated acoustic characteristic to a conventional type headphones having only two reproduction speakers by using the acoustic signal reproduction device 11*a*.

EXAMPLE 2

In Example 2 of the present invention, a method for generating compensation data X which allows an influence of a difference in the head shape among individual listeners on compensation effects of an acoustic characteristic to be lessened will be described.

A structure of an acoustic signal reproduction device according to Example 2 is identical to that of the acoustic signal reproduction device 1 of the FIG. 1. When the compensation data X is input to the signal processing section 3 of the acoustic signal reproduction device 1, the signal processing section 3 acts as a filter for filtering an audio signal IN to generate an acoustic signal OUT. Hereinafter, the signal processing section 3 to which the compensation data X has been input is referred to as a "filter X".

Figure 9A:
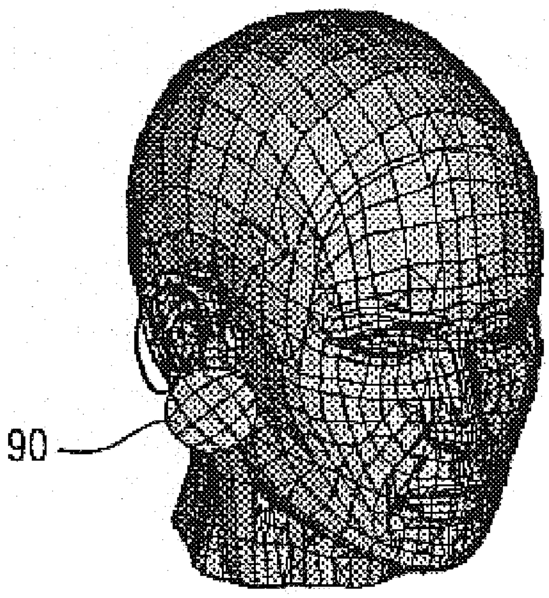
FIG. 9A illustrates a shape of a head model W.
Figure 9B:
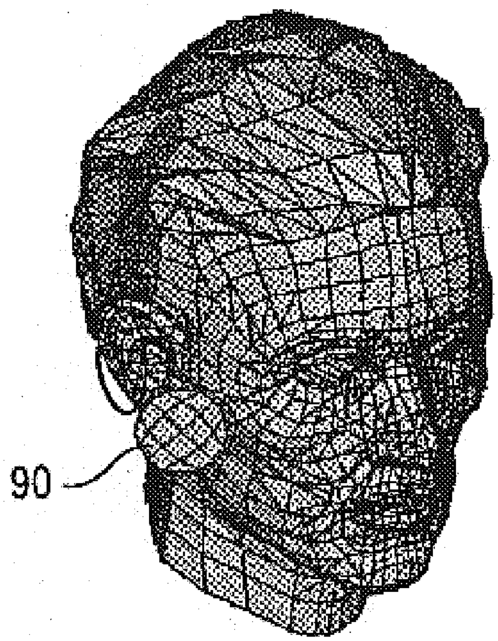
FIG. 9B illustrates a shape of a head model M.

FIGS. 9A and 9B show two different types of head models. For convenience of explanation, the head models shown in FIGS. 9A and 9B will be referred to as a "head model W" and a "head model M", respectively, in the description below. In FIGS. 9A and 9B, reference numeral 90 represents an approximate position of the reproduction speaker 2.

Figure 10:
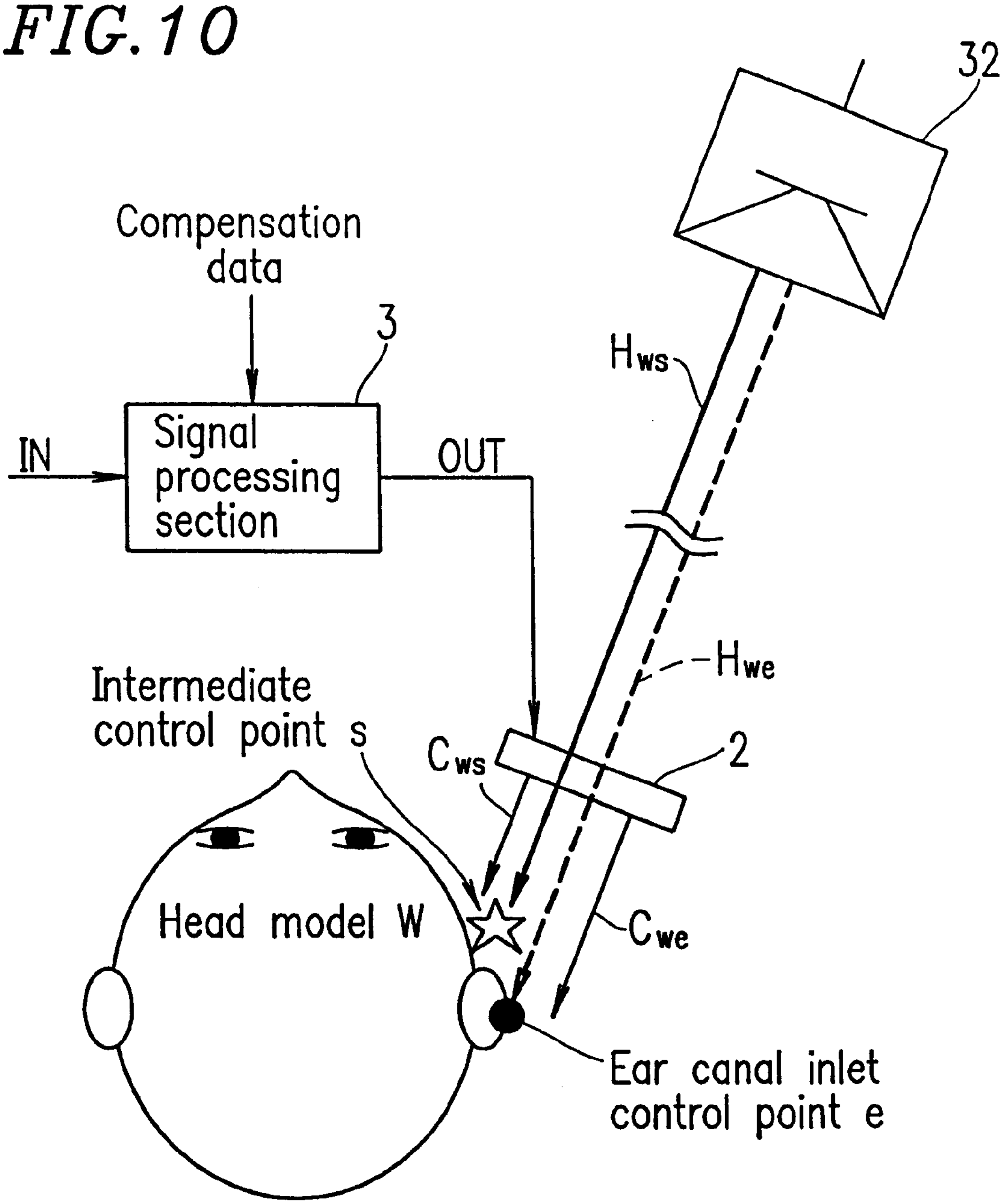
FIG. 10 shows a control point for the head model W and the transfer function regarding the head model W.

FIG. 10 shows a control point for the head model W and the transfer function regarding the head model W.

The ear canal inlet control point e (denoted by a black dot in FIG. 10) is positioned in the right ear hole of the head model W. The intermediate control point s (denoted by a star mark in FIG. 10) is positioned between the right ear hole of the head model W and the reproduction speaker 2 located nearest to the ear hole. The reproduction speaker 2 is located out of contact with the right ear of the head model W. The reproduction speaker 2 is connected to the signal processing section 3.

In FIG. 10, $H_{we}$ is a transfer function from a reference speaker (e.g., a reference speaker 32) to the ear canal inlet control point e, $C_{we}$ is a transfer function from the reproduction speaker 2 to the ear canal inlet control point e, $H_{ws}$ is a transfer function from the reference speaker to the intermediate control point s, and $C_{ws}$ is a transfer function from the reproduction speaker 2 to the intermediate control point s.

Filters $X_{we}$ and $X_{ws}$ are defined regarding the head model W. The filter $X_{we}$ is defined by $X_{we}=H_{we}/C_{we}$. The filter $X_{ws}$ is defined by $X_{ws}=H_{ws}/C_{ws}$.

Similarly, filters $X_{me}$ and $X_{ms}$ are defined regarding the head model M. The filter $X_{me}$ is defined by $X_{me}=H_{me}/C_{me}$. The filter $X_{ms}$ is defined by $X_{ms}=H_{ms}/C_{ms}$.

Figure 11:
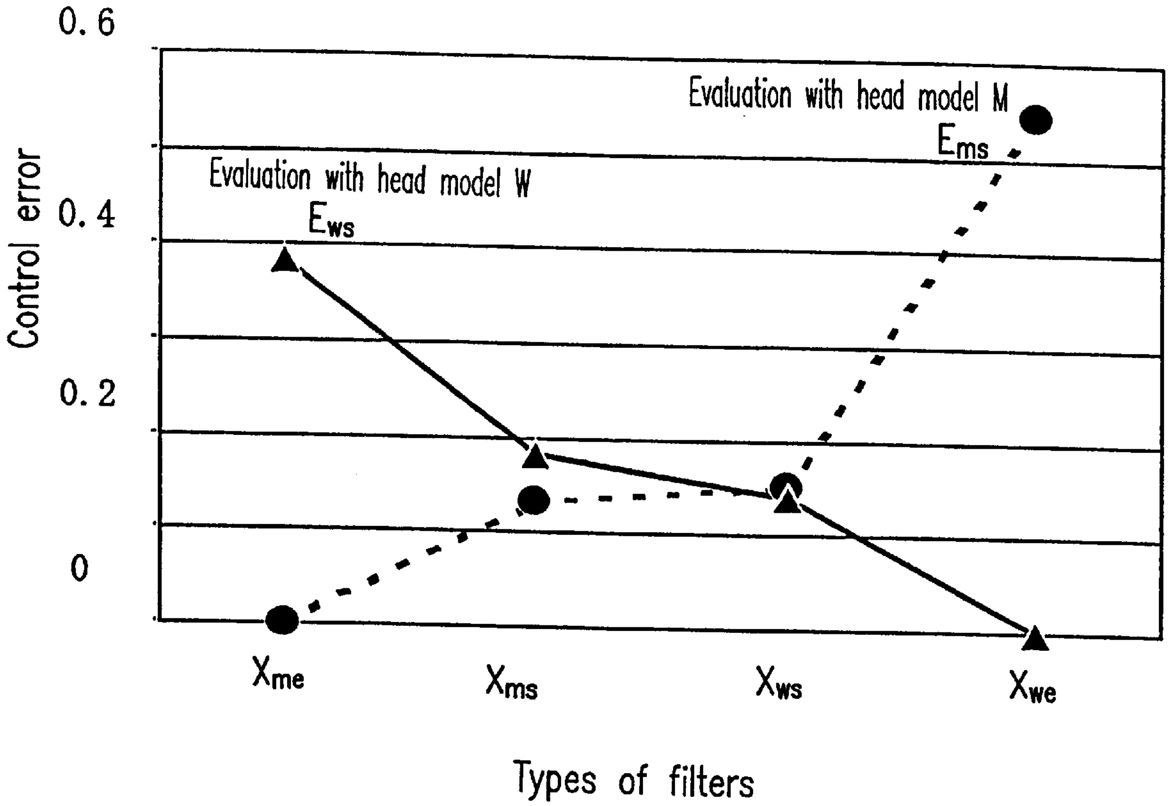
FIG. 11 is a graph illustrating the results obtained by evaluating each of four types of filters with the respective head models W and M.

FIG. 11 is a graph illustrating the results obtained by evaluating each of four types of filters (i.e., the filters $X_{we}$, $X_{we}$, $X_{me}$, and $X_{ms}$) with head models W and M. In FIG. 11, the solid line represents the evaluation result with the head model W, and the dotted line represents the evaluation result with the head model M.

The filters $X_{we}$ and $X_{me}$ designed based on the control point e allow an acoustic signal reproduced by the reference speaker (hereinafter, referred to as a "reference speaker acoustic signal") to match an acoustic signal reproduced by the reproduction speaker (hereinafter, referred to as a "reproduction speaker acoustic signal") at the control point e. The filters $X_{ws}$ and $X_{ms}$ designed based on the control point s allow the reference speaker acoustic signal to match the reproduction speaker acoustic signal at the control point s.

In FIG. 11, regarding the filters $X_{we}$ and $X_{me}$ designed based on the control point e, it will be appreciated that a value of a control error between the reference speaker acoustic signal and the reproduction speaker acoustic signal is zero when they are evaluated with the same head model as the head model used for the design. Whereas a value of a control error between the reference speaker acoustic signal and the reproduction speaker acoustic signal is greater than zero when they are evaluated with a different head model from the head model used for the design. On the other hand, regarding the filters $X_{ws}$ and $X_{ms}$ designed based on the control point s, it will be appreciated that a value of the control error between the reference speaker acoustic signal and the reproduction speaker acoustic signal is not as great as the value of a control error regarding the filters $X_{we}$ and $X_{me}$, even when being evaluated with a different head model from the head model used for the design.

For example, the evaluation of the filter $X_{ws}$ with the head model W is performed based on a value of a control error $E_{ws}$ represented by the following expression (8) using a composite transfer function H' used in the following expression (7). The filter $X_{ws}$ is more highly evaluated as the value of the control error $E_{ws}$ is smaller.

$$H'=C_{we}\cdot X_{ws} \qquad \text{expression (7)}$$

$$E_{ws}=\frac{1}{n}\sum_{i=1}^{n}\frac{\|\,|H'(f_i)|-|H_{we}(f_i)|\,\|^2}{|H_{we}(f_i)|^2}=\frac{1}{n}\sum_{i=1}^{n}\left|\left|\frac{X_{ws}(f_i)}{X_{we}(f_i)}\right|-1\right|^2 \qquad \text{expression (8)}$$

$$\underset{(n=1)}{200\text{ Hz}}\le f_i\le\underset{(n=50)}{10\text{ kHz}}$$

From expression (8), it is appreciated that the value of the control error $E_{ws}$ is equivalent to a degree of approximation between the filter $X_{we}$ designed based on the control point e and the filter $X_{ws}$ designed based on the control point s.

The value of $X_{ws}$ used in expression (7) is obtained, for example, as a coefficient of the adaptive filter 47 in block 401 of FIG. 7. In this case, it is assumed that in blocks 400 and 401, the head model W is located as the dummy head 42, the microphone 41 is located at the control point s, and the coefficient of the adaptive filter 44 of block 400 is copied into the digital filter 46 of block 401 as its coefficient. Alternatively, the value of $X_{ws}$ may be obtained using computer simulation.

The value of $H_{we}$ used in expression (8) is obtained, for example, as a coefficient of the adaptive filter 44 in block 400 of FIG. 7. In this case, it is assumed that in block 400, the head model W is located as the dummy head 42 and the microphone 41 is located at the control point e. Alternatively, the value of $H_{we}$ may be obtained using computer simulation.

The value of $C_{we}$ used in expression (7) is obtained, for example, by dividing the value of $X_{we}$ obtained as the coefficient of the adaptive filter 47 by the value of $H_{we}$ in block 401 of FIG. 7. In this case, it is assumed that in blocks 400 and 401, the head model W is located as the dummy head 42, the microphone 41 is located at the control point e, and the value of $H_{we}$ is copied into the digital filter 46 of block 401 as its coefficient. Alternatively, the value of $C_{we}$ may be obtained using computer simulation.

Figure 12:
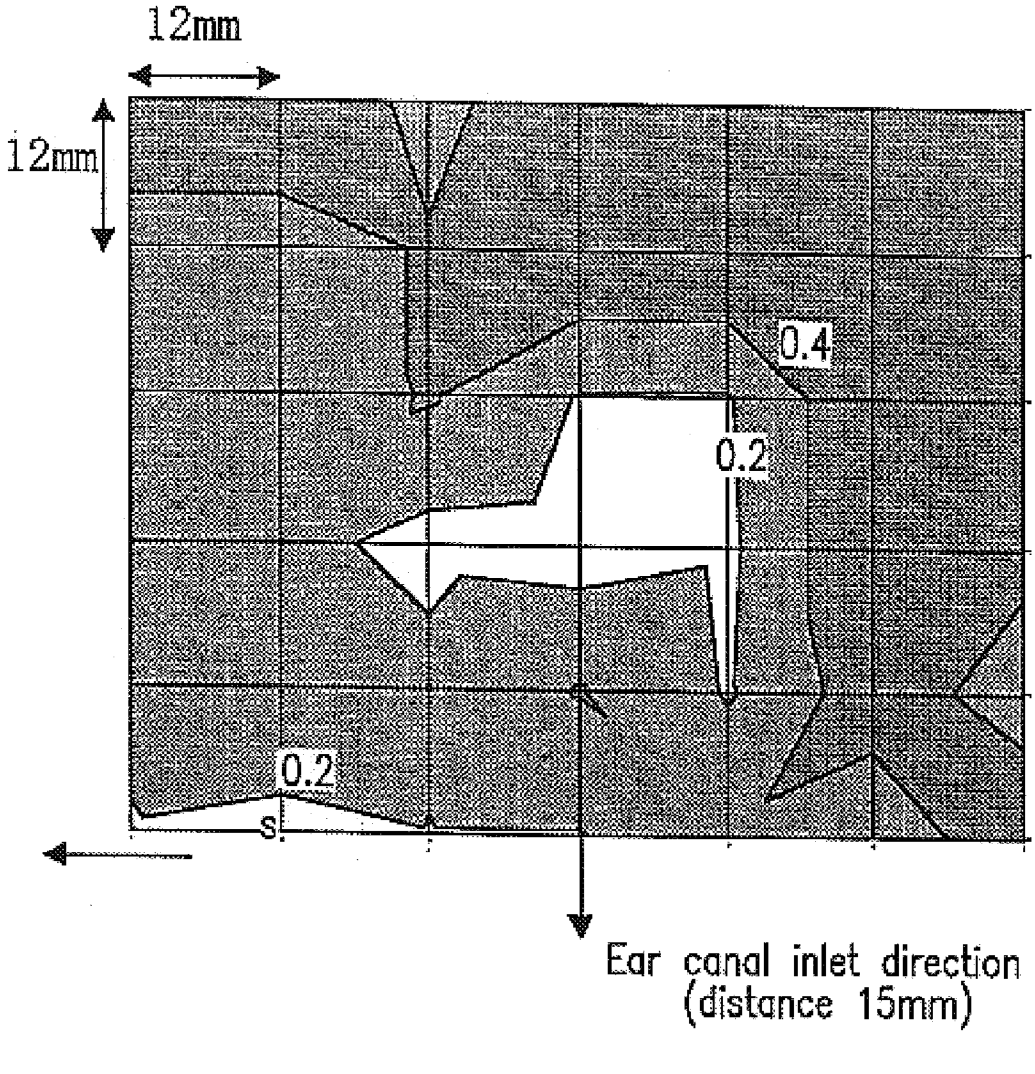
FIG. 12 illustrates a distribution of control errors on a horizontal plane of an ear canal inlet when a filter $X_{ws}$ is evaluated with the head model W.

FIG. 12 illustrates a distribution of control errors on a horizontal plane of the ear canal inlet when the filter $X_{ws}$ is evaluated with the head model W.

Figure 13:
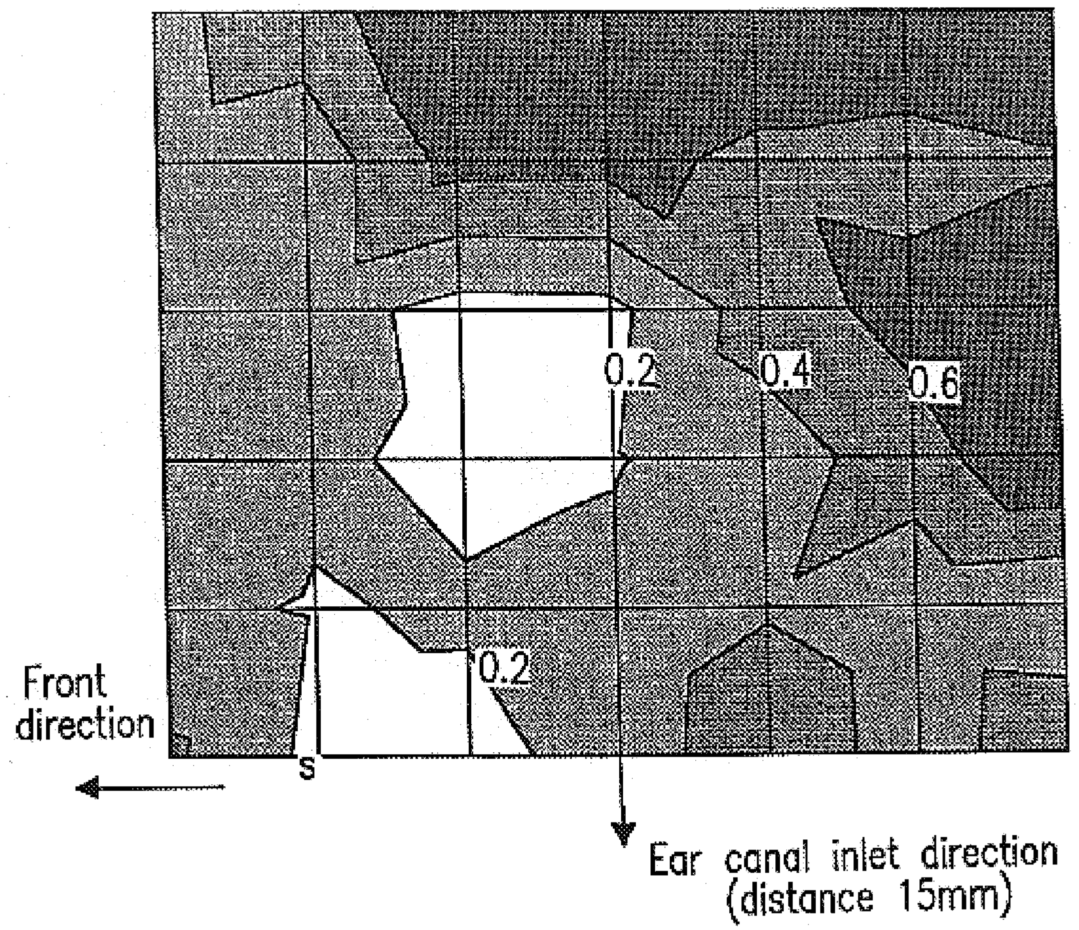
FIG. 13 illustrates a distribution of control errors on a horizontal plane of an ear canal inlet when the filter $X_{ws}$ is evaluated with the head model M.

FIG. 13 illustrates a distribution of control errors on a horizontal plane of the ear canal inlet when the filter $X_{ws}$ is evaluated with the head model M.

Referring to FIGS. 12 and 13, it will be appreciated that there are areas in which the value of a control error is smaller than 0.2 (white areas in FIGS. 12 and 13) in the front half of the ear canal inlet and a space slightly away from the ear canal inlet. By locating the control point s in an area where one of such areas in FIG. 12 overlaps one of such areas in FIG. 13, it is possible to always keep the value of a control error relatively small, regardless of the type of the head model.

As described above, according to Example 2, it is possible to generate the compensation data X (=H/C) based on the intermediate control point s to lessen an influence of the difference in the head shape among individual listeners on compensation effects of the acoustic characteristic.

The method described in Example 2 is effective for an acoustic signal reproduction device having a reproduction speaker which is out of contact with an ear of a listener. The number of the reproduction speakers included in the acoustic signal reproduction device may be any number equal to or more than 1.

According to the acoustic signal reproduction device of the present invention, an acoustic signal having an acoustic characteristic compensated based on compensation data is out put to are production speaker. Thus, the listener can recognize as if the sound reaches the ear of the listener from the reference speaker through the transfer function H while the sound actually reaches the ear of the listener from the reproduction speaker through the transfer function C.

Moreover, it is possible to prepare compensation data for the respective reproduction speakers used by the listener so as to compensate for the acoustic characteristic suitable for the respective reproduction speakers.

Moreover, it is possible to lessen an influence of the difference in the head shape among individual listeners on compensation effects of the acoustic characteristic.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An acoustic signal reproduction device, comprising:

a reproduction speaker; and a signal processing section for generating an acoustic signal for causing a listener to recognize a reference speaker, wherein the signal processing section includes:

a compensation data input section for receiving compensation data from the outside of the acoustic signal reproduction device; and a calculation section for calculating the acoustic signal based on the audio signal and the compensation data and outputting the acoustic signal to the reproduction speaker, and wherein the compensation data has a value H/C, where H is a transfer function from the reference speaker to a control point located in the vicinity of an ear of the listener, and C is a transfer function from the reproduction speaker to the control point located in the vicinity of the ear of the listener, and wherein the reproduction speaker is out of contact with the ear of the listener.

2. An acoustic signal reproduction device according to claim 1, wherein:

the reproduction speaker is located nearest to an ear hole of the listener so as to be out of contact with the ear of the listener; and the control point is located between the ear hole of the listener and the reproduction speaker.

3. An acoustic signal reproduction device according to claim 1, wherein:

the compensation data is prestored in a recording medium; and the compensation data input section receives the compensation data read from the recording medium.

4. An acoustic signal reproduction device according to claim 1, wherein the compensation data input section receives the compensation data via a network.

5. An acoustic signal reproduction device, comprising:

first and third reproduction speakers for a right ear of a listener;

second and fourth reproduction speakers for a left ear of the listener;

a signal processing section for processing first through fifth audio signals to generate first and second acoustic signals for causing the listener to recognize first through third reference speakers, and third and fourth acoustic signals for causing the listener to recognize fourth and fifth reference speakers, wherein the signal processing section includes: a compensation data input section for receiving first to tenth compensation data from the outside of the acoustic signal reproduction device;

a first calculation section for calculating the first acoustic signal based on the first through third audio signals and the first through third compensation data and outputting the first acoustic signal to the first reproduction speaker;

a second calculation section for calculating the second acoustic signal based on the first through third audio signals and the fourth through sixth compensation data and outputting the second acoustic signal to the second reproduction speaker;

a third calculation section for calculating the third acoustic signal based on the fourth and fifth audio signals and the seventh and eighth compensation data and outputting the third acoustic signal to the third reproduction speaker; and a fourth calculation section for calculating the fourth acoustic signal based on the fourth and fifth audio signals and the ninth and tenth compensation data and outputting the fourth acoustic signal to the fourth reproduction speaker, wherein the first compensation data has a value $H_{1R}/C_1$, the second compensation data has a value $H_{2R}/C_1$, the third compensation data has a value $H_{3R}/C_1$, the fourth compensation data has a value $H_{1L}/C_2$, the fifth compensation data has a value $H_{2L}/C_2$, the sixth compensation data has a value $H_{3L}/C_2$, the seventh compensation data has a value $H_{4R}/C_3$, the eighth compensation data has a value $H_{5R}/C_3$, the ninth compensation data has a value $H_{4L}/C_4$, and the tenth compensation data has a value $H_{5L}/C_4$, wherein $H_{1R}$ is a transfer function from the first reference speaker to a control point located in the vicinity of a right ear of the listener, $H_{2R}$ is a transfer function from the second reference speaker to the control point located in the vicinity of the right ear of the listener, $H_{3R}$ is a transfer function from the third reference speaker to the control point located in the vicinity of the right ear of the listener, $H_{4R}$ is a transfer function from the fourth reference speaker to the control point located in the vicinity of the right ear of the listener, and $H_{5R}$ is a transfer function from the fifth reference speaker to the control point located in the vicinity of the right ear of the listener, $H_{1L}$ is a transfer function from the first reference speaker to a control point located in the vicinity of a left ear of the listener, $H_{2L}$ is a transfer function from the second reference speaker to the control point located in the vicinity of the left ear of the listener, $H_{3L}$ is a transfer function from the third reference speaker to the control point located in the vicinity of the left ear of the listener, $H_{4L}$ is a transfer function from the fourth reference speaker to the control point located in the vicinity of the left ear of the listener, and $H_{5L}$ is a transfer function from the fifth reference speaker to the control point located in the vicinity of the left ear of the listener, and $C_1$ is a transfer function from the first reproduction speaker to the control point located in the vicinity of the right ear of the listener, $C_2$ is a transfer function from the second reproduction speaker to the control point located in the vicinity of the left ear of the listener, $C_3$ is a transfer function from the third reproduction speaker to the control point located in the vicinity of the right ear of the listener, and $C_4$ is a transfer function from the fourth reproduction speaker to the control point located in the vicinity of the left ear of the listener.

6. An acoustic signal reproduction device according to claim 5, wherein:

the first reference speaker is a virtual sound source located on a straight line making an angle of about zero degrees with a straight line running through the center of the head of the listener;

the second reference speaker is a virtual sound source located on a straight line making an angle of about +30 degrees with the straight line running through the center of the head of the listener;

the third reference speaker is a virtual sound source located on a straight line making an angle of about −30 degrees with the straight line running through the center of the head of the listener;

the fourth reference speaker is a virtual sound source located on a straight line making an angle of about +110 degrees to about +120 degrees with the straight line running through the center of the head of the listener; and the fifth reference speaker is a virtual sound source located on a straight line making an angle of about −110 degrees to about −120 degrees with the straight line running through the center of the head of the listener.

7. An acoustic signal reproduction device according to claim 5, wherein:

the first through fourth reproduction speakers are included in headphones;

the first reproduction speaker and the second reproduction speaker are located forward with respect to a vertical plane including a straight line connecting a hole of the right ear and a hole of the left ear of the listener;

the third reproduction speaker and the fourth reproduction speaker are located rearward with respect to the vertical plane; and the first through fourth reproduction speakers are out of contact with the right ear and the left ear of the listener.

* * * * *